United States Patent
Kuno et al.

(10) Patent No.: US 12,237,156 B2
(45) Date of Patent: Feb. 25, 2025

(54) WAFER PLACEMENT TABLE

(71) Applicant: NGK Insulators, Ltd., Nagoya (JP)

(72) Inventors: Tatsuya Kuno, Nagoya (JP); Masaki Ishikawa, Handa (JP); Seiya Inoue, Handa (JP)

(73) Assignee: NGK INSULATORS, LTD., Nagoya (JP)

(*) Notice: Subject to any disclaimer, the term of this patent is extended or adjusted under 35 U.S.C. 154(b) by 120 days.

(21) Appl. No.: 18/166,611

(22) Filed: Feb. 9, 2023

(65) Prior Publication Data
US 2023/0420230 A1      Dec. 28, 2023

Related U.S. Application Data

(63) Continuation of application No. PCT/JP2022/025789, filed on Jun. 28, 2022.

(51) Int. Cl.
   *H01J 37/32*   (2006.01)
   *F28F 3/08*    (2006.01)
   *H01L 21/683*  (2006.01)

(52) U.S. Cl.
   CPC ........ *H01J 37/32724* (2013.01); *F28F 3/083* (2013.01); *F28F 3/086* (2013.01);
   (Continued)

(58) Field of Classification Search
   CPC .. H01L 21/6833; H01J 37/32724; F28F 3/083
   See application file for complete search history.

(56) References Cited

U.S. PATENT DOCUMENTS

| | | | |
|---|---|---|---|
| 10,249,526 B2* | 4/2019 | Parkhe | H01L 21/67109 |
| 11,289,356 B2* | 3/2022 | Hayashi | H01J 37/32724 |

(Continued)

FOREIGN PATENT DOCUMENTS

| | | |
|---|---|---|
| JP | H02-135141 U1 | 11/1990 |
| JP | 2002-246160 A | 8/2002 |

(Continued)

OTHER PUBLICATIONS

International Search Report and Written Opinion (Application No. PCT/JP2022/025789) dated Sep. 20, 2022.

(Continued)

*Primary Examiner* — Scott Bauer
(74) *Attorney, Agent, or Firm* — BURR PATENT LAW, PLLC

(57) ABSTRACT

A wafer placement table includes an upper substrate including a ceramic substrate and having a wafer placement surface, a lower substrate disposed on a lower surface of the upper substrate including a refrigerant flow path or a refrigerant flow-path groove, a through hole extending through the lower substrate in an up-down direction to intersect with the refrigerant flow path or the refrigerant flow-path groove, a screw hole provided in the lower surface of the upper substrate, at a position facing the through hole, a screw member inserted from a lower surface of the lower substrate into the through hole and screwed into the screw hole, and a refrigerant-leakage prevention member that prevents the refrigerant from leaking out to the lower surface of the lower substrate through the through hole into which the screw member is inserted.

6 Claims, 11 Drawing Sheets

(52) U.S. Cl.
CPC ...... *H01L 21/6833* (2013.01); *F28F 2230/00* (2013.01); *H01J 2237/002* (2013.01); *H01J 2237/2007* (2013.01)

(56) References Cited

U.S. PATENT DOCUMENTS

| | | |
|---|---|---|
| 2006/0279899 A1 | 12/2006 | Aihara et al. |
| 2014/0069585 A1 | 3/2014 | Aoto et al. |
| 2014/0209245 A1* | 7/2014 | Yamamoto .......... H01L 21/6831 361/234 |
| 2016/0111315 A1 | 4/2016 | Parkhe |
| 2019/0019714 A1* | 1/2019 | Kosakai ................. H02N 13/00 |
| 2019/0066985 A1 | 2/2019 | Hirose et al. |
| 2019/0131163 A1* | 5/2019 | Kuno ................ H01L 21/67109 |
| 2019/0189491 A1 | 6/2019 | Akatsuka |

FOREIGN PATENT DOCUMENTS

| | | |
|---|---|---|
| JP | 2006-344955 A | 12/2006 |
| JP | 2014-053481 A | 3/2014 |
| JP | 2017-538278 A | 12/2017 |
| JP | 2019-041024 A | 3/2019 |
| WO | 2018/038044 A1 | 3/2018 |

OTHER PUBLICATIONS

English translation of the International Preliminary Report on Patentability (Chapter I) dated Jan. 9, 2025 (Application No. PCT/JP2022/025789).

\* cited by examiner

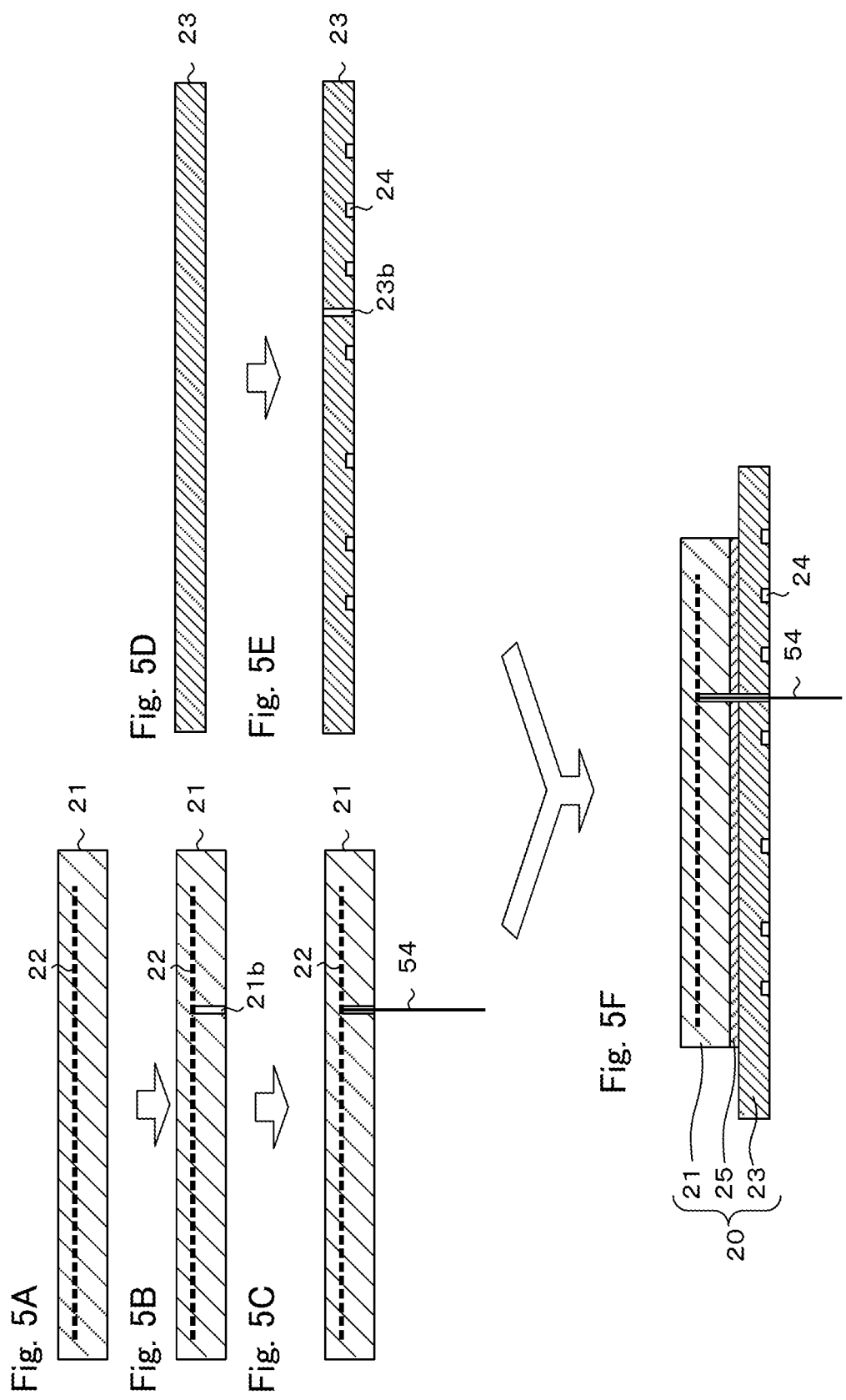

WAFER PLACEMENT TABLE

BACKGROUND OF THE INVENTION

1. Field of the Invention

The present invention relates to a wafer placement table.

2. Description of the Related Art

There is a known wafer placement table including a ceramic substrate having a wafer placement surface and incorporating an electrode, and a metal plate disposed on a surface of the ceramic substrate opposite to the wafer placement surface. In the wafer placement table in Patent Literature 1, a plurality of through holes are provided in the metal plate, screw holes are provided, in the lower surface of the ceramic substrate, at positions facing the through holes, and screw members are each inserted from the lower surface of the metal plate into a corresponding one of the through holes and are screwed into a corresponding one of the screw holes to fasten the ceramic substrate and the metal plate to each other.

CITATION LIST

Patent Literature

PTL 1: WO 2018/038044 A1

SUMMARY OF THE INVENTION

To improve efficiency in cooling of a wafer in the wafer placement table having such a structure, it may be considered to provide a refrigerant flow path at the metal plate. In such a case, when the refrigerant flow path is provided so as to avoid the screw members, flexibility in design of the refrigerant flow path is decreased, and portions where the screw members are provided are not easily cooled. Therefore, there is a problem that the in-plane temperature distribution of the wafer is not easily set to a desired temperature distribution.

The present invention has been made to solve such problems, and a main object of the present invention is to facilitate setting of an in-plane temperature distribution of a wafer to a desired temperature distribution in a wafer placement table in which an upper substrate and a lower substrate are fastened to each other by a screw member.

[1] A wafer placement table according to the present invention includes: an upper substrate including a ceramic substrate that incorporates an electrode and having a wafer placement surface at an upper surface of the ceramic substrate; a lower substrate disposed on a surface of the upper substrate opposite to the wafer placement surface, and including a refrigerant flow path through which a refrigerant flows or a refrigerant flow-path groove constituting a side wall and a bottom of the refrigerant flow path; a through hole extending through the lower substrate in an up-down direction to intersect with the refrigerant flow path or the refrigerant flow-path groove; a screw hole provided, in a lower surface of the upper substrate, at a position facing the through hole; a screw member inserted from a lower surface of the lower substrate into the through hole and screwed into the screw hole; and a refrigerant-leakage prevention member that prevents the refrigerant from leaking out to the lower surface of the lower substrate through the through hole into which the screw member is inserted.

In the wafer placement table, the upper substrate and the lower substrate are fastened to each other by the screw member. The lower substrate includes the refrigerant flow path or the refrigerant flow-path groove. The screw member is inserted from the lower surface of the lower substrate into the through hole extending through the lower substrate in the up-down direction to intersect with the refrigerant flow path or the refrigerant flow-path groove, and is screwed into the screw hole of the upper substrate. The refrigerant leakage prevention member prevents the refrigerant from leaking out through the through hole into which the screw member is inserted. Consequently, there is no need to bypass the screw member to provide the refrigerant flow path. Therefore, flexibility in design of the refrigerant flow path or the refrigerant flow-path groove is increased. In addition, since the screw member is cooled by the refrigerant, a portion where the screw member is provided is also easily cooled. As a result, with the wafer placement table according to the present invention, the in-plane temperature distribution of a wafer is easily set to a desired temperature distribution.

In the present description, the present invention may be described using wordings, such as up-down, left-right, and front-rear. Up-down, left-right, and front-rear, however, merely indicate relative positional relationships. Therefore, when the orientation of the wafer placement table is changed, up-down may become left-right, and left-right may become up-down. Even such a case is included in the technical scope of the present invention.

[2] In the wafer placement table according to the present invention (the wafer placement table described in [1] above), the lower substrate may include the refrigerant flow-path groove, and the upper substrate may include the ceramic substrate, a ceiling substrate disposed on a lower side of the ceramic substrate and constituting a ceiling of the refrigerant flow path, and a metal joint layer joining the ceramic substrate and the ceiling substrate to each other.

[3] In the wafer placement table according to the present invention (the wafer placement table described in above), an absolute value of a difference in a coefficient of linear thermal expansion at 40° C. to 400° C. between the ceiling substrate and the ceramic substrate may be $1.5 \times 10^{-6}$/K or less. Consequently, a difference in the thermal expansion between the ceramic substrate and the ceiling substrate is small. It is thus possible to suppress a warp and damage of the upper substrate caused by thermal stress. Note that, in the present description, a coefficient of linear thermal expansion obtained by measuring lengths at 40° C. and 400° C. is referred as a coefficient of linear thermal expansion at 40° C. to 400° C.

[4] In the wafer placement table according to the present invention (the wafer placement table described in or [3] above), the ceiling substrate may be made of a composite material of metal and ceramic. The composite material of metal and ceramic can reduce the absolute value of a difference in the coefficient of linear thermal expansion between the ceramic substrate and the ceiling substrate. In addition, due to having higher toughness than ceramic materials, the composite material of metal and ceramic is less likely to be damaged even when thermal stress is generated.

[5] In the wafer placement table according to the present invention (the wafer placement table described in any one of [1] to [4] above), a heat dissipation sheet may be disposed between the lower surface of the upper substrate and an upper surface of the lower substrate. Consequently, the heat dissipation sheet is in close contact with the upper substrate and the lower substrate firmly as a result of the upper substrate and the lower substrate being fastened to each other by the screw member. Therefore, the heat of the upper substrate is immediately conducted to the lower substrate easily. As a result, efficiency in cooling of a wafer is improved.

[6] In the wafer placement table according to the present invention (the wafer placement table described in any one of [1] to [5] above), the lower substrate may be made of an easily machinable material. Consequently, it is possible to easily form the refrigerant flow path or the refrigerant flow-path groove in the lower substrate and thus is possible to reduce machining costs.

BRIEF DESCRIPTION OF THE DRAWINGS

FIGS. 5A to 5F illustrate manufacturing processes (manufacturing processes of the upper substrate 20) of the wafer placement table 10.

DETAILED DESCRIPTION OF THE INVENTION

Figure 1:
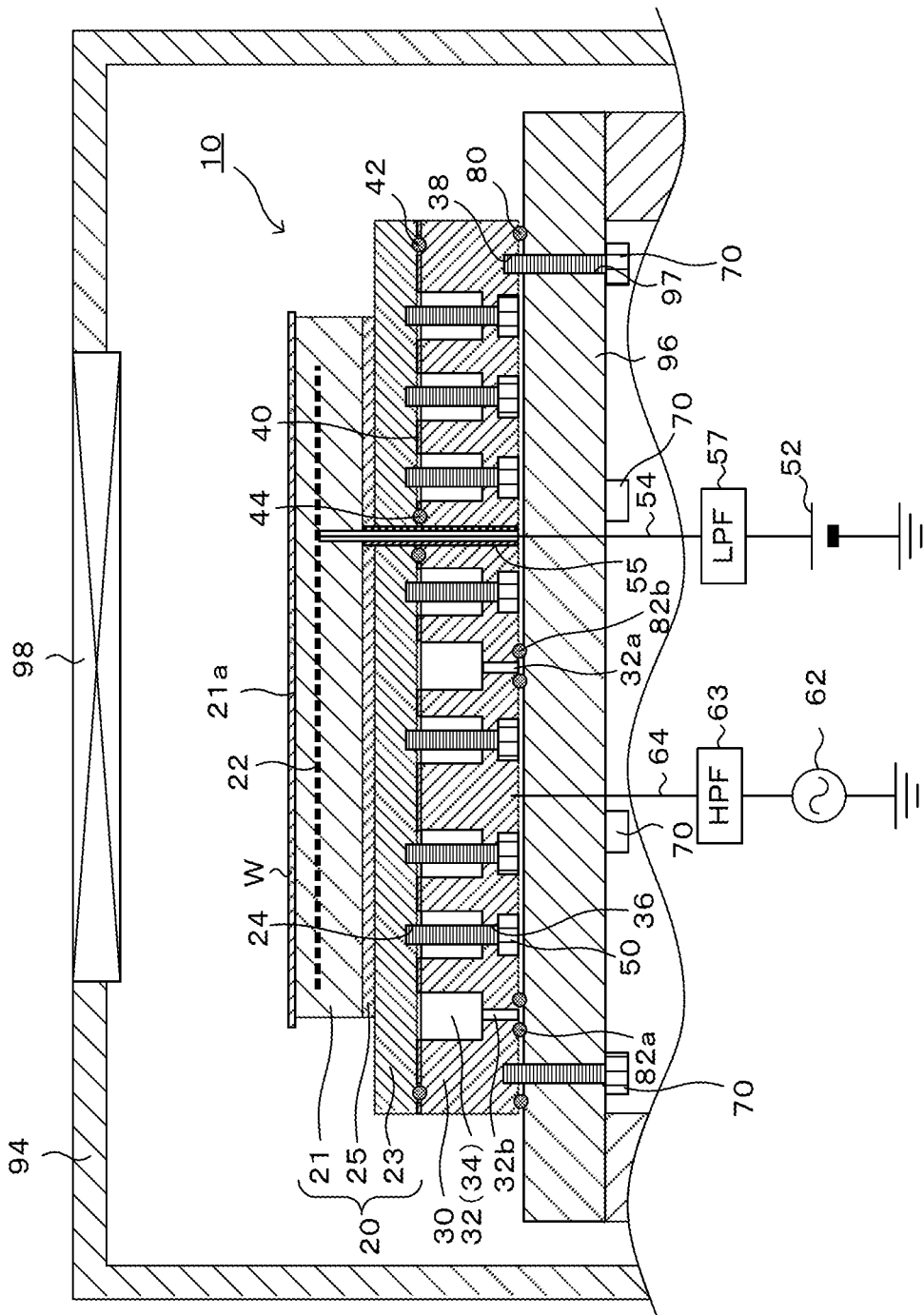
FIG. 1 is a vertical cross-sectional view of a wafer placement table 10 installed in a chamber 94.
Figure 2:
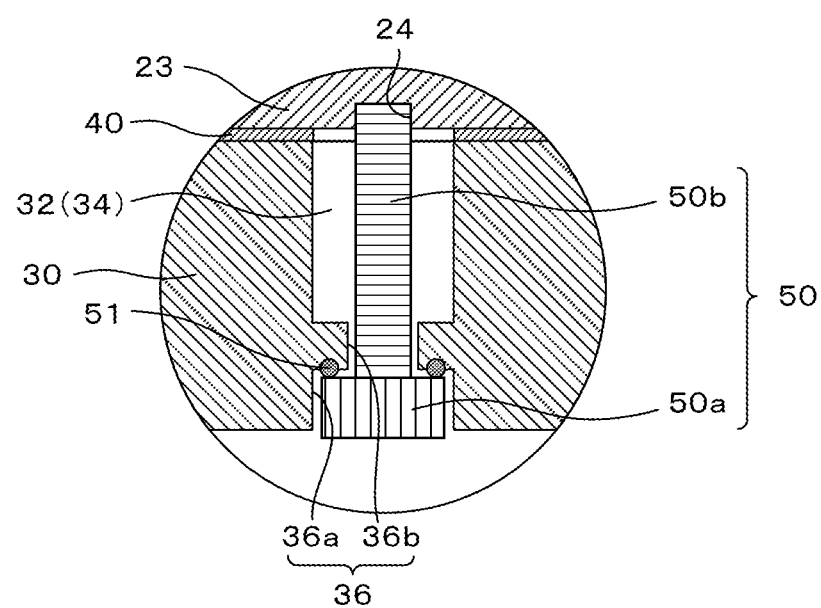
FIG. 2 is a partially enlarged view of FIG. 1.
Figure 3:
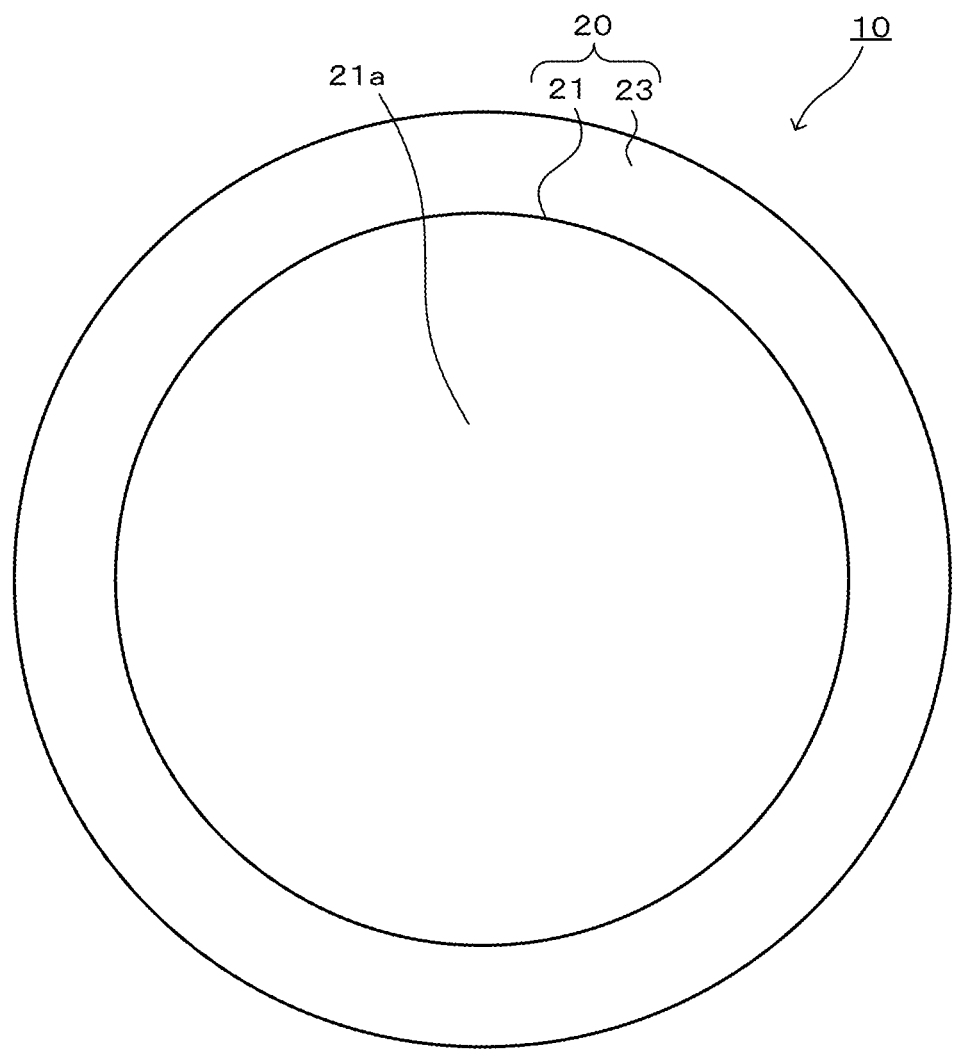
FIG. 3 is a plan view of the wafer placement table 10.
Figure 4:
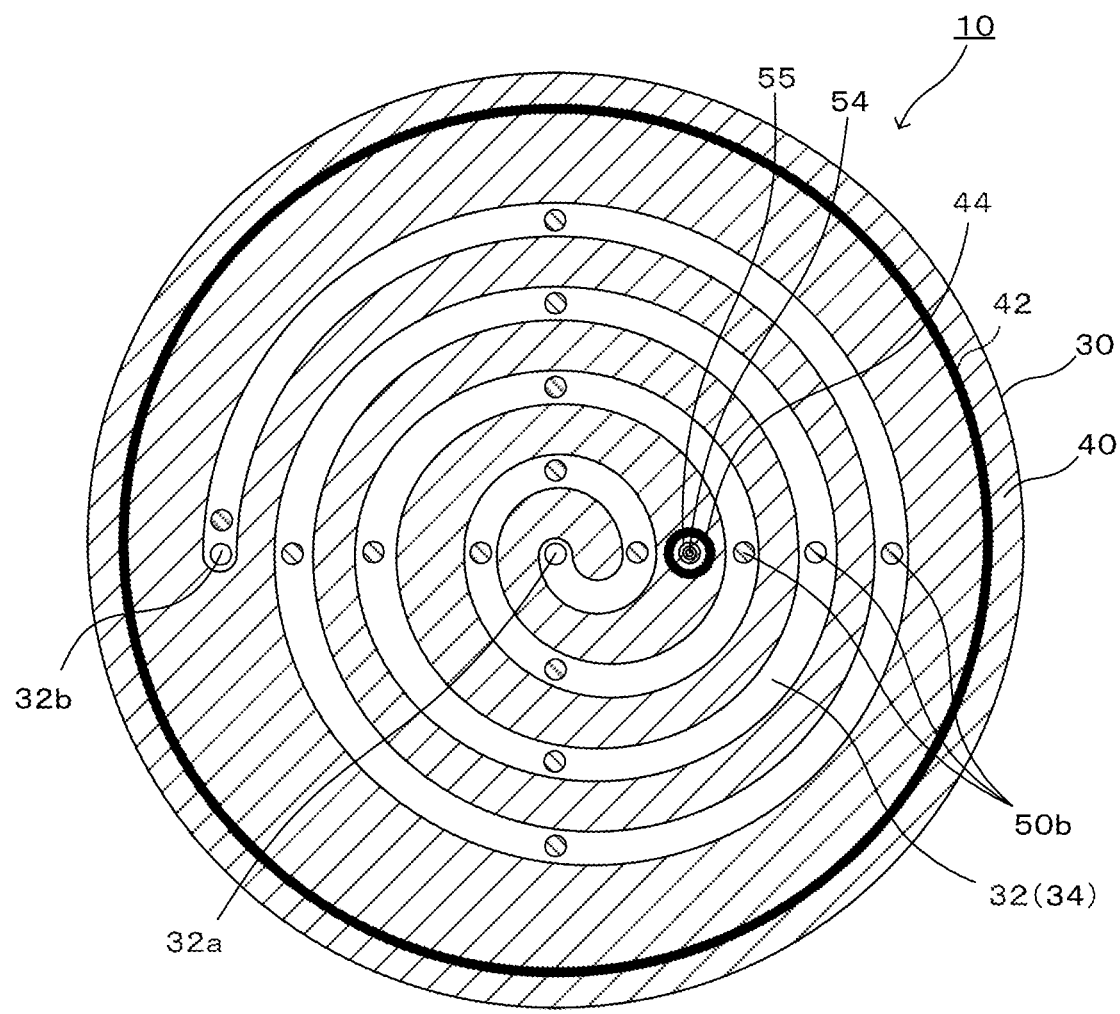
FIG. 4 is a sectional view in which a section obtained by cutting the wafer placement table 10 between an upper substrate 20 and a lower substrate 30 is viewed from above.

A suitable embodiment of the present invention will be described with reference to the drawings. FIG. 1 is a vertical cross-sectional view of a wafer placement table 10 installed in a chamber 94 (a sectional view of the wafer placement table 10 cut along a plane including the center axis of the wafer placement table 10). FIG. 2 is a partially enlarged view of FIG. 1. FIG. 3 is a plan view of the wafer placement table 10. FIG. 4 is a sectional view in which a section obtained by cutting the wafer placement table 10 between an upper substrate 20 and a lower substrate 30 is viewed from above. In the present description, the wording "to" indicating numerical value ranges is used to mean that numerical values described before and after the wording are included as a lower limit value and an upper limit value.

The wafer placement table 10 is to be used for performing CVD, etching, or the like on a wafer W by using plasma, and is fixed to an installation plate 96 provided in an inner portion of the chamber 94 for semiconductor processing. The wafer placement table 10 includes an upper substrate 20, a lower substrate 30, the heat dissipation sheet 40, and screw members 50.

The upper substrate 20 includes a ceramic substrate 21, a ceiling substrate 23 disposed on the lower side of the ceramic substrate 21 and constituting the ceiling of a refrigerant flow path 32, and a metal joint layer 25 joining the ceramic substrate 21 and the ceiling substrate 23 to each other. The thickness of the upper substrate 20 is preferably 8 mm or more or 10 mm or more in consideration of strength thereof and is preferably 25 mm or less in consideration of cooling efficiency thereof.

The ceramic substrate 21 includes a wafer placement surface 21a having a circular shape. The wafer W is to be placed on the wafer placement surface 21a. The ceramic substrate 21 is made of a ceramic material represented by alumina, aluminum nitride, and the like. The ceramic substrate 21 incorporates a wafer attraction electrode 22 on a side close to the wafer placement surface 21a. The wafer attraction electrode 22 is made of a material containing, for example, W, Mo, WC, MoC, or the like. The wafer attraction electrode 22 is a unipolar electrostatic electrode having a disk shape or a mesh shape. In the ceramic substrate 21, a layer on the upper side of the wafer attraction electrode 22 functions as a dielectric layer. A wafer attraction direct-current power source 52 is connected to the wafer attraction electrode 22 with a power supply terminal 54 interposed therebetween. The power supply terminal 54 is provided to extend from the lower surface of the ceramic substrate 21 to the wafer attraction electrode 22 by passing through an insulating tube 55 disposed in a hole extending in the up-down direction through the lower substrate 30, the ceiling substrate 23, and the metal joint layer 25. A low pass filter (LPF) 57 is provided between the wafer attraction direct-current power source 52 and the wafer attraction electrode 22.

The ceiling substrate 23 is a disk slightly larger than the ceramic substrate 21 and is made of an electrically conductive material. Examples of the electrically conductive material are a composite material, a metal, and the like. An example of the composite material is a composite material of metal and ceramic, or the like. Examples of the composite material of metal and ceramic are a metal matrix composite material (MMC), a ceramic matrix composite material (CMC), and the like. Specific examples of such a composite material are a material containing Si, SiC, and Ti, a material in which Al and/or Si is impregnated in a SiC porous body, and the like. A material containing Si, SiC, and Ti is referred to as SiSiCTi, a material in which Al is impregnated in a SiC porous body is referred to as AlSiC, and a material in which Si is impregnated in a SiC porous body is referred to as SiSiC. An example of the metal is Mo or the like. The absolute value of a difference in the coefficient of linear thermal expansion at 40° C. to 400° C. between a material used in the ceiling substrate 23 and a ceramic material used in the ceramic substrate 21 is preferably $1.5 \times 10^{-6}$/K or less, more preferably $1.0 \times 10^{-6}$/K or less, and further more preferably $0.5 \times 10^{-6}$/K or less. The thickness of the ceiling substrate 23 is preferably 3 mm or more or 6 mm or more in consideration of strength thereof and is preferably 20 mm or less in consideration of cooling efficiency thereof.

The lower surface of the ceiling substrate 23 is provided with a plurality of screw holes 24. The screw holes 24 are each provided at a position facing a corresponding one of through holes 36 described later. The screw holes 24 are formed by providing cylindrical holes in the lower surface of the ceiling substrate 23 and forming a screw groove on each of the cylindrical holes directly. The screw holes 24 are, however, not particularly limited thereto. For example, the screw holes 24 may be each formed by inserting a helical screw insert into a cylindrical hole, or by inserting the female threaded terminal (for example, a cap nut) in Patent Literature 1 into a cylindrical hole and performing brazing thereon. An interval between the centers of two mutually adjacent screw holes 24 is preferably, for example, 100 mm or less but is not particularly limited. Consequently, the upper substrate 20 and the lower substrate 30 can be fastened to each other more tightly, and, eventually, the heat-conduction performance of the heat dissipation sheet 40 is improved.

The metal joint layer 25 joins the lower surface of the ceramic substrate 21 and the upper surface of the ceiling substrate 23 to each other. The metal joint layer 25 may be, for example, a layer made of solder or a metal brazing material. The metal joint layer 25 is formed by, for example, TCB (thermal compression bonding). TCB is a publicly known method in which a metal joint material is sandwiched between two members that are objects to be joined and in which the two members in a state heated to a temperature less than or equal to the solidus temperature of the metal join material are pressurized and joined to each other.

The lower substrate 30 is a disk member made of an easily machinable material. In the present embodiment, the outer diameter of the lower substrate 30 is identical to the outer diameter of the ceiling substrate 23. The upper surface of the lower substrate 30 is provided with a refrigerant flow-path groove 34. The refrigerant flow-path groove 34 constitutes a side wall and a bottom of the refrigerant flow path 32. The refrigerant flow-path groove 34 is formed in a one-stroke pattern to have a spiral shape from an inlet 32a to an outlet 32b of the refrigerant flow path 32 so as to extend over an entire region in which the ceramic substrate 21 is disposed (FIG. 4). The inlet 32a and the outlet 32b of the refrigerant flow path 32 extend through the lower surface of the lower substrate 30 and the bottom surface of the refrigerant flow-path groove 34. The inlet 32a and the outlet 32b of the refrigerant flow path 32 are connected to a refrigerant cooling device, which is not illustrated. A refrigerant discharged through the outlet 32b is returned again to the inlet 32a after the temperature of the refrigerant is adjusted, and is supplied to the inside of the refrigerant flow path 32. Preferably, the refrigerant that flows in the refrigerant flow path 32 is a fluid and is electrically insulative. An example of the electrically insulative fluid is a fluorine-based inert fluid or the like. The easily machinable material used in the lower substrate 30 is preferably a material that is machinable more easily than the ceiling substrate 23. As an index of machinability, for example, the machinability index presented in JIS B 0170(2020) is usable. As the easily machinable material, a material having a machinability index of 40 or more is preferable, a material having a machinability index of 100 or more is more preferable, and a material having a machinability index of 140 or more is further preferable. Examples of the easily machinable material are aluminum, an aluminum alloy, stainless steel (SUS material), and the like.

The lower substrate 30 is connected to a RF power source 62 with a power supply terminal 64 interposed therebetween. The lower substrate 30 thus also functions as a radio frequency (RF) electrode for plasma generation. A high pass filter (HPF) 63 is disposed between the lower substrate 30 and the RF power source 62.

The lower substrate 30 has a plurality of the through holes 36. The through holes 36 extend through the lower substrate 30 in the up-down direction to intersect with the refrigerant flow path 32 (refrigerant flow-path groove 34). Specifically, as illustrated in FIG. 2, the through holes 36 are stepped holes extending through the lower surface of the lower substrate 30 and the bottom of the refrigerant flow path 32. Each through hole 36 includes a large-diameter portion 36a for housing a head portion 50a of the screw member 50, and a small-diameter portion 36b allowing a leg portion 50b of the screw member 50 to pass therethrough while not allowing the head portion 50a to pass therethrough.

The heat dissipation sheet 40 is disposed between the lower surface of the upper substrate 20 and the upper surface of the lower substrate 30. In the present embodiment, the heat dissipation sheet 40 is disposed between the lower surface of the ceiling substrate 23 and a portion of the upper surface of the lower substrate 30 where the refrigerant flow-path groove 34 is not provided and seal members 42 and 44 are also not provided. The heat dissipation sheet 40 is sandwiched between the upper substrate 20 and the lower substrate 30 and compressed in the up-down direction. Consequently, the heat dissipation sheet 40 is in close contact with the lower surface of the upper substrate 20 and the upper surface of the lower substrate 30 firmly. The heat of the upper substrate 20 is therefore conducted to the lower substrate 30 immediately. The thermal resistance of the heat dissipation sheet 40 is preferably 0.35 K·cm$^2$/W or less and more preferably 0.1 K·cm$^2$/W or less. The Young's modulus of the heat dissipation sheet 40 is preferably 100 MPa or less, more preferably 20 MPa or less, and further preferably 5 MPa or less. The thermal resistance can be measured, for example, in accordance with ASTM D5470. Specifically, the heat dissipation sheet 40 is preferably a sheet containing carbon and resin. Examples of the carbon are graphite, carbon fibers, carbon nanotubes, and the like, and example of the resin are a silicone resin and the like. When graphite is employed, it is preferable to dispose the graphite such that the surface direction of graphene constituting the graphite is in the up-down direction. When the carbon fibers or the carbon nanotubes are employed, it is preferable to dispose the carbon fibers or the carbon nanotubes such that the axial direction thereof is in the up-down direction. As a material of the heat dissipation sheet 40, for example, a thermal interface material (TIM) is usable. Specific examples of the heat dissipation sheet 40 are EX20000C4S (manufactured by Dexerials Corporation), GraphitePAD and GraphiteTIM (registered trademarks) (both manufactured by Panasonic Corporation), and the like. The Poisson's ratio of the heat dissipation sheet 40 is preferably 0.4 or less, more preferably 0.3 or less, and further preferably 0.2 or less. As the Poisson's ratio of the heat dissipation sheet 40 is smaller, the fastening force of the screw members 50 is transmitted to the entire surface of the heat dissipation sheet 40 more uniformly and does not easily escape in the lateral direction. Therefore, the heat dissipation sheet 40 is in close contact at the entire surface thereof with the ceiling substrate 23 and the lower substrate 30 firmly. It is thus possible to more uniformly cool the wafer W. The shore hardness (ShoreOO) of the heat dissipation sheet 40 may be 50 or more and 80 or less. The thickness of the heat dissipation sheet 40 is, for example, 0.05 mm or more and 1 mm or less and more preferably 0.1 mm or more and 0.3 mm or less.

As illustrated in FIG. 2, each screw member 50 has the head portion 50a having a large diameter and the leg portion 50b having a small diameter. Each screw member 50 is inserted from the lower surface of the lower substrate 30 into a corresponding one of the through holes 36, and the screw member 50 passes through the refrigerant flow path 32 (refrigerant flow-path groove 34) and is screwed into a corresponding one of the screw holes 24 of the ceiling substrate 23. The material of the screw members 50 is preferably a material having favorable electrical conductivity and favorable thermal conductivity. For example, stainless steel is preferable. An O-ring 51 is disposed between the head portion 50*a* of the screw member 50 and a step portion (the boundary between the large-diameter portion 36*a* and the small-diameter portion 36*b*) of the through hole 36. The head portion 50*a* of the screw member is housed in the large-diameter portion 36*a* so as not to protrude downward from the lower surface of the lower substrate 30. As a result of the screw members 50 being screwed into the screw holes 24, the upper substrate 20 and the lower substrate 30 are fastened to each other in a state of sandwiching the heat dissipation sheet 40 and the seal members 42 and 44. Consequently, the heat dissipation sheet and the seal members 42 and 44 are compressed in the up-down direction. The seal member 42 is a metal or resin ring having an outer diameter slightly smaller than the diameter of the lower substrate 30. By being compressed in the up-down direction, the seal member 42 exerts sealing performance and prevents the refrigerant from leaking out from the refrigerant flow path 32 to the outer peripheral side. The seal member 44 is a metal or resin ring inserted on the outer side of the insulating tube 55. The seal member 44 exerts sealing performance by being compressed in the up-down direction. The O-ring 51 is compressed between the head portion 50*a* of the screw member 50 and the step portion of the through hole 36 in the up-down direction and exerts sealing performance. Consequently, the O-ring 51 prevents the refrigerant in the refrigerant flow path 32 from leaking out to the lower surface of the lower substrate through the through hole 36 into which the screw member is inserted. The width of the refrigerant flow path 32 (refrigerant flow-path groove 34) is set to a width with which the flow of the refrigerant is not blocked by the leg portion 50*b*.

The side surface (outer peripheral surface) of the metal joint layer 25, the upper surface and the side surface of the ceiling substrate 23, and the side surface of the lower substrate 30 may be covered with an insulating film, as necessary. An example of the insulating film is a sprayed film of alumina, yttria, or the like.

Figure 6A:
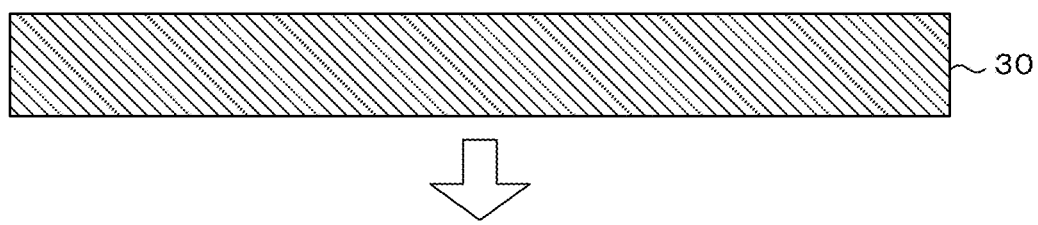
FIGS. 6A and 6B illustrate manufacturing processes (manufacturing processes of the lower substrate 30) of the wafer placement table 10.
Figure 6B:
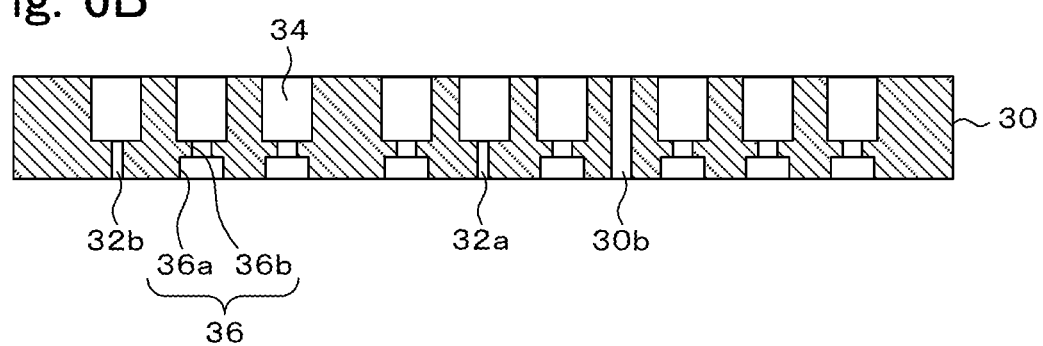
Figure 7A:
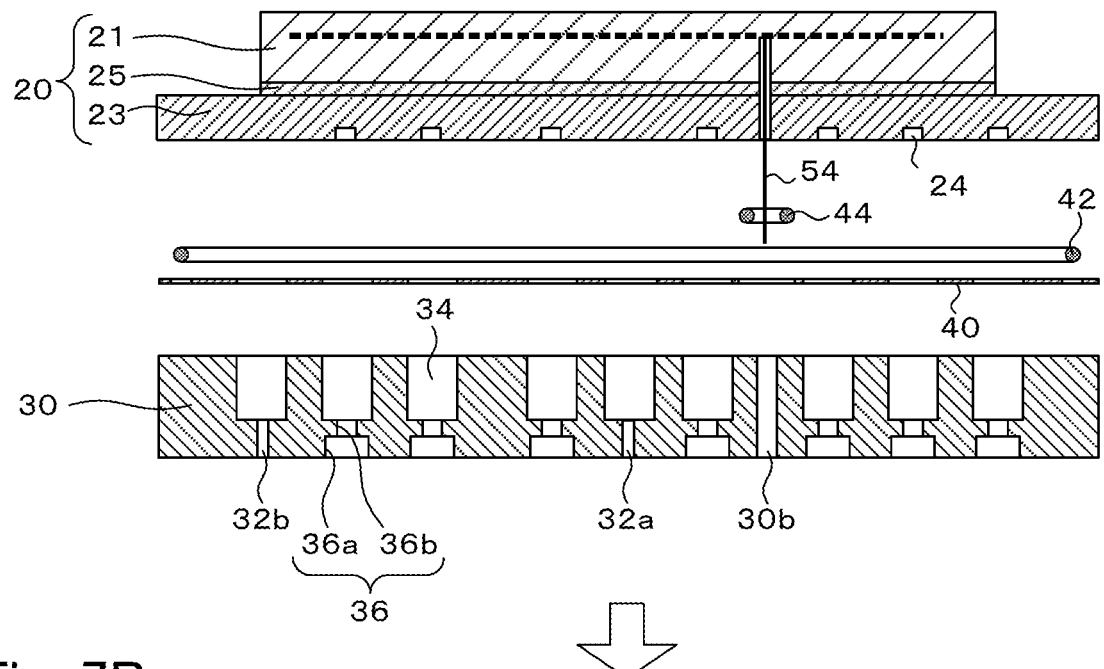
FIGS. 7A and 7B illustrate manufacturing processes (assembling processes of the wafer placement table 10) of the wafer placement table 10.
Figure 7B:
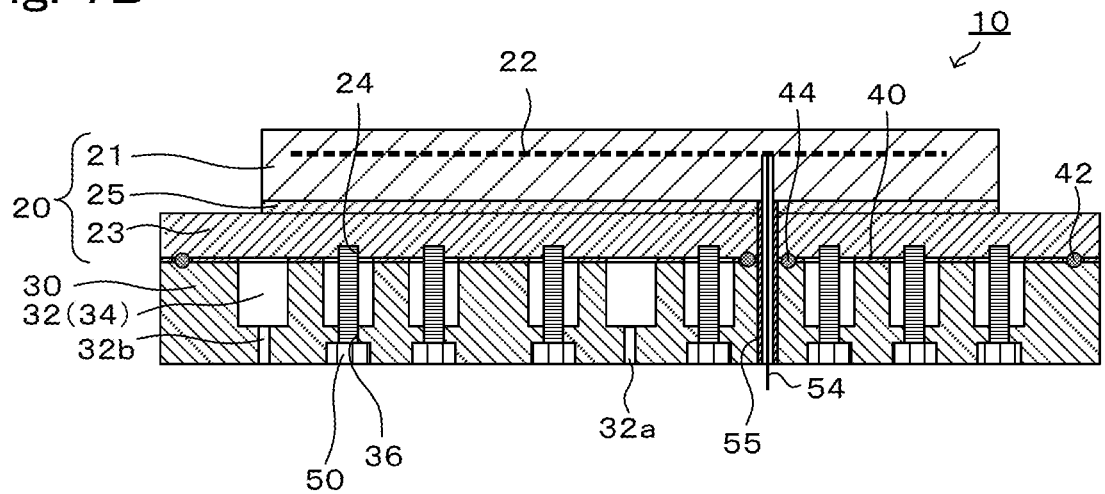

Next, an example of manufacture of the wafer placement table 10 will be described with reference to FIGS. to 5F to FIGS. 7A and 7B. FIGS. 5A to 5F to FIGS. 7A and 7B illustrate manufacturing processes of the wafer placement table 10. FIGS. 5A to 5F illustrate manufacturing processes of the upper substrate 20, FIGS. 6A and 6B illustrate manufacturing processes of the lower substrate 30, and FIGS. 7A and 7B illustrate assembling processes of the wafer placement table 10.

The upper substrate 20 is produced, for example, as follows. First, the ceramic substrate 21 is produced by subjecting a molded body of ceramic powder to hot press sintering (FIG. 5A). The ceramic substrate 21 incorporates the wafer attraction electrode 22. Next, a hole 21*b* is formed from the lower surface of the ceramic substrate 21 to the wafer attraction electrode 22 (FIG. 5B), and the power supply terminal 54 is inserted into the hole 21*b* to join the power supply terminal 54 and the wafer attraction electrode 22 to each other (FIG. 5C).

In parallel with this, the disk-shaped ceiling substrate 23 is produced (FIG. 5D), a through hole 23*b* extending through the ceiling substrate 23 in the up-down direction is formed, and the screw holes 24 are formed at predetermined positions in the lower surface of the ceiling substrate 23 (FIG. 5E). When the ceramic substrate 21 is made of alumina, the ceiling substrate 23 is preferably made of SiSiCTi or AlSiC. This is because SiSiCTi or AlSiC can have a coefficient of thermal expansion substantially equal to the coefficient of thermal expansion of alumina.

The ceiling substrate 23 made of SiSiCTi can be produced by, for example, as follows. First, silicon carbide, metal Si, and metal Ti are mixed to produce a powder mixture. Next, the obtained powder mixture is subjected to uniaxial pressure molding to produce a disk-shaped molded body, and the molded body is subjected to hot-press sintering under an inert atmosphere to obtain the ceiling substrate 23 made of SiSiCTi.

Next, a circular metal joint material is disposed on the upper surface of the ceiling substrate 23. The metal joint material is previously provided with a through hole that is to be in communication with the through hole 23*b* of the ceiling substrate 23. Then, while the power supply terminal 54 of the ceramic substrate 21 is inserted into the through hole of the metal joint material and the through hole 23*b* of the ceiling substrate 23, the ceramic substrate 21 is placed on the metal joint material. Consequently, a layered body in which the ceiling substrate 23, the metal joint material, and the ceramic substrate 21 are layered in this order from the bottom is obtained. The upper substrate 20 is obtained by pressurizing the layered body while heating the layered body (TCB) (FIG. 5F). The upper substrate 20 is constituted by the ceramic substrate 21 that is joined to the upper surface of the ceiling substrate 23 with the metal joint layer 25 interposed therebetween.

TCB is performed, for example, as follows. That is, the layered body is pressurized and joined at a temperature less than or equal to the solidus temperature of the metal joint material (for example, more than or equal to a temperature obtained by subtracting 20° C. from the solidus temperature and less than or equal to the solidus temperature). The layered body is then returned to room temperature. Consequently, the metal joint material becomes a metal joint layer (or an electrically conductive joint layer). As the metal joint material in this case, an Al—Mg joint material or an Al—Si—Mg joint material is usable. For example, when the Al—Si—Mg joint material is used to perform TCB, the layered body is pressurized in a state heated under a vacuum atmosphere. The metal joint material having a thickness of substantially 100 μm is preferably usable.

In parallel with the production of the upper substrate 20, the disk-shaped lower substrate 30 is produced with an easily machinable material (FIG. 6A). Next, a terminal hole 30*b* extending through the lower substrate 30 in the up-down direction is formed, and the refrigerant flow-path groove 34 is formed on the upper surface of the lower substrate 30. In addition, the inlet 32*a* and the outlet 32*b* of the refrigerant flow path 32 are formed at one end and the other end of the refrigerant flow-path groove 34, and the through holes 36 each having the large-diameter portion 36*a* and the small-diameter portion 36*b* are formed at desired positions in the refrigerant flow-path groove 34 (FIG. 6B).

Next, the upper substrate 20 and the lower substrate 30 are fastened to each other by the screw members thereby producing the wafer placement table 10. Specifically, as illustrated in FIG. 7A, the heat dissipation sheet 40 is first disposed on the upper surface of the lower substrate 30. The heat dissipation sheet 40 is obtained by cutting out a portion corresponding to the opening of the refrigerant flow-path groove 34 from a circular sheet having a diameter identical to the diameter of the lower substrate 30. In the heat dissipation sheet portions where the seal members 42 and 44 are to be disposed are also cut out. Next, the seal member 42 is disposed along the outer periphery of the lower substrate and the seal member 44 is disposed along the opening edge of the terminal hole 30b. Next, while the power supply terminal 54 of the upper substrate 20 is inserted into the terminal hole 30b, the upper substrate 20 is disposed on the heat dissipation sheet 40 and the seal members 42 and 44 disposed on the upper surface of the lower substrate 30. Next, the screw members 50 are each inserted from the lower surface of the lower substrate 30 into a corresponding one of the through holes 36 and screwed into a corresponding one of the screw holes 24 of the upper substrate 20. Consequently, the heat dissipation sheet 40 is compressed between the upper substrate 20 and the lower substrate 30 and exerts high heat-conduction performance. The seal members 42 and 44 are also compressed between the upper substrate 20 and the lower substrate 30 and exert sealing performance. Thereafter, the insulating tube 55 into which the power supply terminal 54 is to be inserted is disposed in the terminal hole 30b (FIG. 7B). The wafer placement table 10 can be obtained as described above.

Next, a usage example of the wafer placement table 10 will be described with reference to FIG. 1. First, the wafer placement table 10 is installed on the installation plate 96 in the chamber 94. Specifically, seal members 80, 82a, and 82b are first disposed between the upper surface of the installation plate 96 and the lower surface of the lower substrate 30. The seal member 80 is a metal or resin ring having an outer diameter slightly smaller than the diameter of the lower substrate 30, and the seal member 80 can be compressed in the up-down direction. The seal members 82a and 82b are metal or resin rings disposed along the opening edges of the inlet 32a and the outlet 32b of the refrigerant flow path 32, respectively, and the seal members 82a and 82b can be compressed in the up-down direction. Next, a screw member 70 is screwed from the lower surface of the installation plate 96 through a screw insertion hole 97 into a screw hole 38 provided in the lower surface of the lower substrate 30. Consequently, the seal members 82a and 82b are compressed in the up-down direction and exert sealing performance to prevent a refrigerant from leaking out from the seal members 82a and 82b to the outer side.

The discoidal wafer W is placed on the wafer placement surface 21a of the wafer placement table 10 installed on the installation plate 96. In this state, a direct-current voltage of the wafer attraction direct-current power source 52 is applied to the wafer attraction electrode 22 to cause the wafer W to be attracted by the wafer placement surface 21a. A refrigerant whose temperature is adjusted is supplied through the inlet 32a of the refrigerant flow path 32, and the refrigerant is discharged through the outlet 32b. Then, the inside of the chamber 94 is set to be in a predetermined vacuum atmosphere (or a reduced-pressure atmosphere), and a RF voltage from the RF power source 62 is applied to the lower substrate 30 while a process gas is supplied from a shower head 98. Consequently, plasma is generated between the wafer W and the shower head 98. The plasma is used to form a CVD film or perform etching on the wafer W.

In the wafer placement table 10 described above, the upper substrate 20 and the lower substrate 30 are fastened to each other by the screw members 50. The lower substrate 30 includes the refrigerant flow-path groove 34. The screw members 50 are inserted from the lower surface of the lower substrate 30 into the through holes 36 extending through the lower substrate 30 in the up-down direction to intersect with the refrigerant flow path 32 (refrigerant flow-path groove 34), and are screwed into the screw holes 24 of the upper substrate 20. The O-ring 51 (refrigerant-leakage prevention member) prevents the refrigerant from leaking out through the through holes 36 into which the screw members 50 are inserted. Consequently, there is no need to bypass the screw members 50 to provide the refrigerant flow path 32. Therefore, flexibility in design of the refrigerant flow path 32 (refrigerant flow-path groove 34) is increased. In addition, since the screw members 50 are cooled by the refrigerant, portions where the screw members 50 are provided are also easily cooled. As a result, with the wafer placement table 10, the in-plane temperature distribution of the wafer W is easily set to a desired temperature distribution.

The absolute value of a difference in the coefficient of linear thermal expansion at 40° C. to 400° C. between the ceiling substrate 23 and the ceramic substrate 21 is preferably $1.5 \times 10^{-6}$/K or less. Consequently, a difference in the thermal expansion between the ceramic substrate 21 and the ceiling substrate 23 is small. It is thus possible to suppress a warp and damage of the upper substrate 20 caused by thermal stress and also possible to suppress damage of the metal joint layer 25 joining the ceramic substrate 21 and the ceiling substrate 23 to each other. The metal joint layer 25 causes favorable heat conduction between the ceramic substrate 21 and the ceiling substrate 23 compared with resin.

In addition, the ceiling substrate 23 is preferably made of a composite material of metal and ceramic. The composite material of metal and ceramic can reduce the absolute value of a difference in the coefficient of linear thermal expansion between the ceramic substrate 21 and the ceiling substrate 23. In addition, due to having higher toughness than ceramic materials, the composite material of metal and ceramic is less likely to be damaged even when thermal stress is generated. In addition, such a composite material has electrical conductivity and thus is usable as a RF electrode.

Furthermore, the heat dissipation sheet 40 is disposed between the lower surface of the upper substrate 20 and the upper surface of the lower substrate 30. The heat dissipation sheet 40 is in close contact with the upper substrate 20 and the lower substrate 30 firmly as a result of the upper substrate 20 and the lower substrate 30 being fastened to each other by the screw members 50. Therefore, the heat of the upper substrate 20 is immediately conducted to the lower substrate 30 easily. As a result, efficiency in cooling of the wafer W is improved.

The lower substrate 30 is made of an easily machinable material. Consequently, it is possible to easily form the refrigerant flow-path groove 34 in the lower substrate 30 and thus is possible to reduce machining costs. Further, material costs can be suppressed to be low compared with when the lower substrate 30 is made of a composite material of metal and ceramic (for example, MMC or CMC).

Furthermore, the heat dissipation sheet 40 has electrical conductivity. Consequently, the lower substrate 30 has an electrical potential identical to those of the ceiling substrate 23 and the metal joint layer 25. It is thus possible to use the ceiling substrate 23 and the metal joint layer 25 as RF electrodes, and plasma is easily generated above the wafer W. The screw members 50 having electrical conductivity may be used to cause the lower substrate 30 and the ceiling substrate 23 to have an identical electrical potential through the screw members 50.

Needless to say, the present invention is not limited to the above-described embodiment at all and can be embodied in various forms as long as the forms belong to the technical scope of the present invention.

Figure 8:
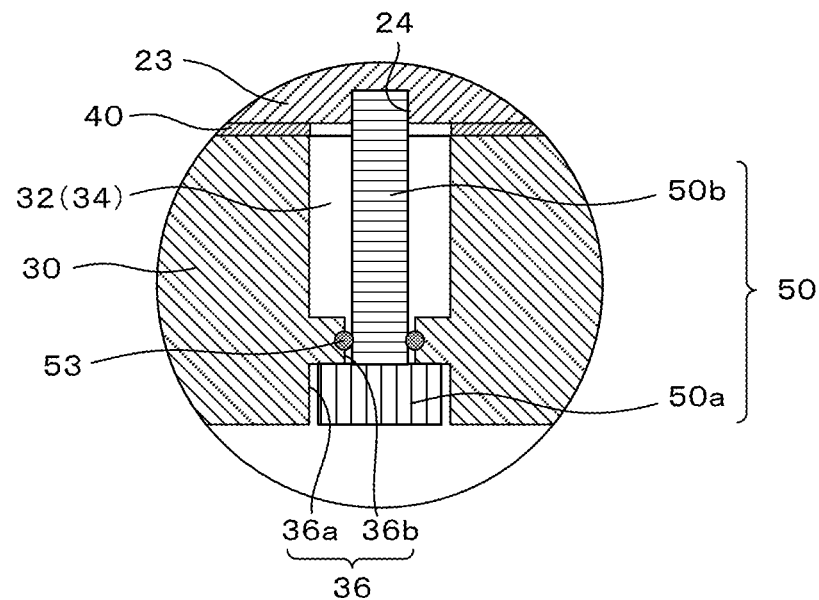
FIG. 8 is a vertical cross-sectional view of a screw member 50 sealed with an O-ring 53.
Figure 9:
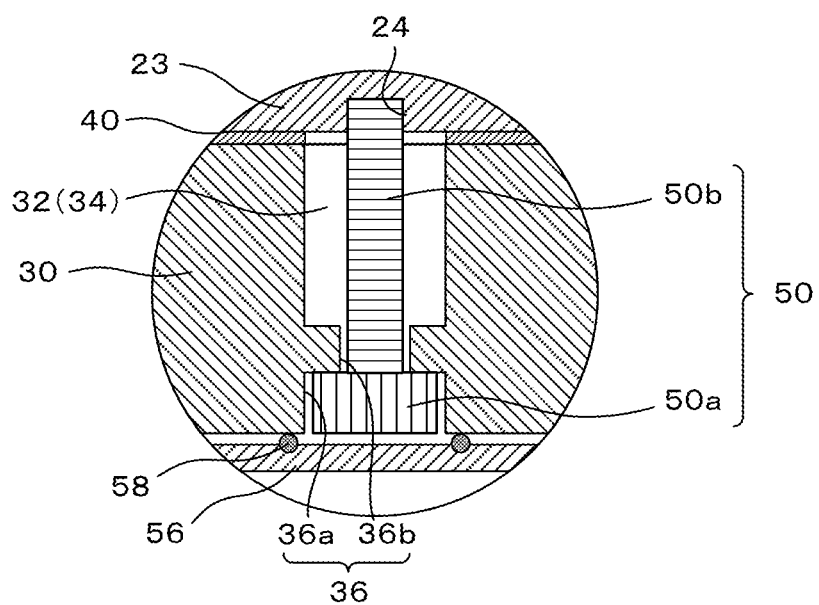
FIG. 9 is a vertical cross-sectional view of a screw member 50 sealed with an O-ring 58.

In the above-described embodiment, the O-ring 51 is disposed as the refrigerant-leakage prevention member between the head portion 50a of each screw member 50 and the step portion of each through hole 36. The refrigerant-leakage prevention member is, however, not limited to the O-ring 51. For example, as illustrated in FIG. 8, an O-ring 53 may be disposed between the inner peripheral surface of the small-diameter portion 36b of each through hole 36 and the outer peripheral surface of the leg portion 50b of each screw member 50. In this case, the O-ring 53 is sandwiched and compressed between the inner peripheral surface of the small-diameter portion 36b of the through hole 36 and the outer peripheral surface of the leg portion 50b of the screw member 50, thereby exerting sealing performance. The O-ring 53 thus prevents the refrigerant from leaking out to the outside through the through hole 36. Alternatively, as illustrated in FIG. 9, an O-ring 58 may be disposed, on the lower surface of the lower substrate 30, at the opening edge of the large-diameter portion 36a of each through hole 36, and a disk member 56 that covers the lower surface of the lower substrate 30 may be screwed and fixed to the lower substrate 30. In this case, the O-ring 58 is sandwiched and compressed between the lower surface of the lower substrate and the upper surface of the disk member 56, thereby exerting sealing performance. The O-ring 58 thus prevents the refrigerant from leaking out to the outside through the through hole 36. In FIG. 8 and FIG. 9, components identical to those in the above-described embodiment are given identical signs.

Figure 10:
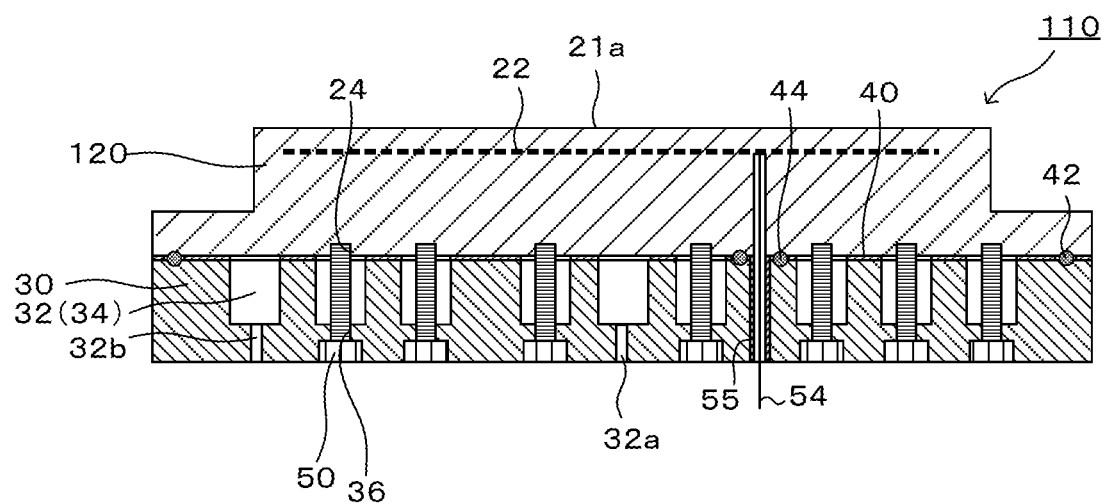
FIG. 10 is a vertical cross-sectional view of a wafer placement table 110.

In the above-described embodiment, the upper substrate 20 is constituted by the ceramic substrate 21 and the ceiling substrate 23 that are joined to each other by the metal joint layer 25. The upper substrate 20 is, however, not particularly limited thereto. For example, as with a wafer placement table 110 illustrated in FIG. 10, an upper substrate 120 may be a ceramic-substrate single layer. In FIG. 10, components identical to those in the above-described embodiment are given identical signs.

Figure 11:
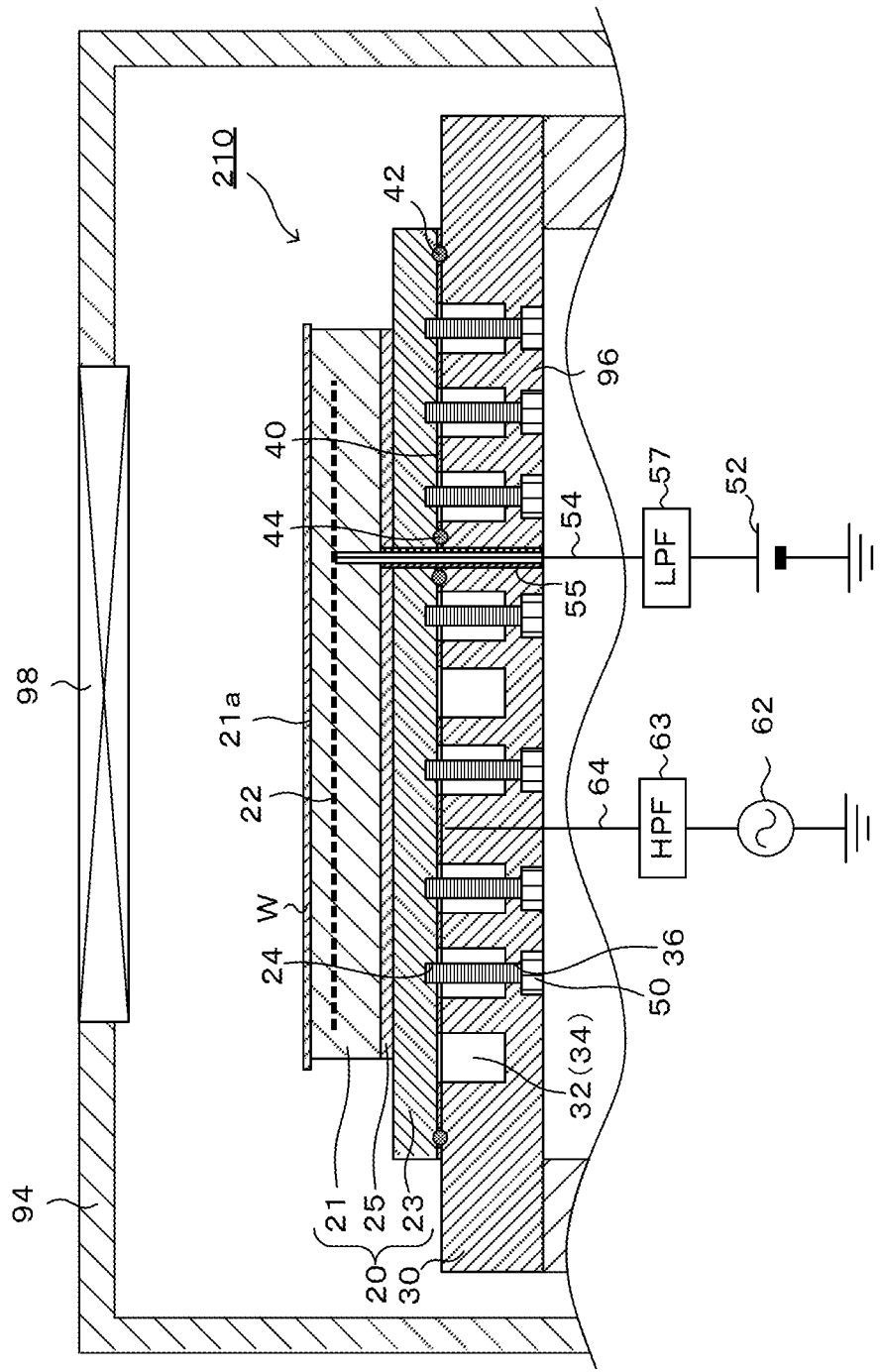
FIG. 11 is a vertical cross-sectional view of a wafer placement table 210.

In the above-described embodiment, the wafer placement table 10 in which the upper substrate 20 and the lower substrate 30 are fastened to each other by the screw members 50 is set on the installation plate 96 of the chamber 94. The wafer placement table 10 is, however, not particularly limited thereto. For example, as with a wafer placement table 210 illustrated in FIG. 11, the lower substrate 30 may be also used as the installation plate 96 of the chamber 94. In FIG. 11, components identical to those in the above-described embodiment are given identical signs.

Figure 12A:
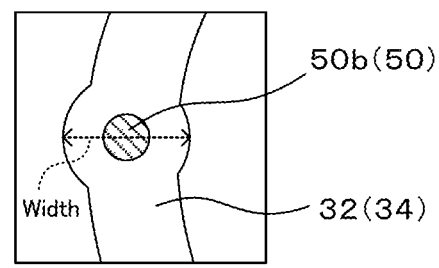
FIGS. 12A and 12B are explanatory views illustrating a portion of a refrigerant flow path 32 where a screw member 50 is present.
Figure 12B:
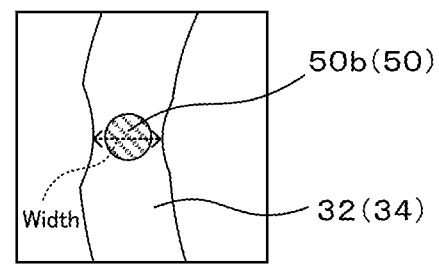

In the above-described embodiment, the width of the refrigerant flow path 32 (refrigerant flow-path groove 34) is constant regardless of presence or absence of the leg portions 50b of the screw members 50. The width of the refrigerant flow path 32 is, however, not particularly limited thereto. For example, to cause the in-plane temperature distribution of the wafer W to be a desired temperature distribution, the widths of, in the refrigerant flow path 32 (refrigerant flow-path groove 34), portions where the leg portions 50b of the screw members 50 are present may be increased (refer to FIG. 12A) and decreased (refer to FIG. 12B).

In the above-described embodiment, the lower substrate 30 includes the refrigerant flow-path groove 34 at the upper surface. The lower substrate 30 is, however, not particularly limited thereto. For example, the lower substrate 30 may incorporate the refrigerant flow path 32.

In the above-described embodiment, the heat dissipation sheet 40 is disposed in a gap between the lower surface of the upper substrate 20 and the upper surface of the lower substrate 30. The heat dissipation sheet 40 is, however, not particularly limited thereto. For example, arrangement of the heat dissipation sheet 40 may be omitted. In such a case, instead of the heat dissipation sheet 40, the refrigerant enters the gap, and the refrigerant that has entered the gap between the lower surface of the upper substrate 20 and the upper surface of the lower substrate 30 does not easily flow and mostly remains in the gap. Therefore, it is difficult to release the heat of the upper substrate 20 to the lower substrate 30 by using the gap. Therefore, it is preferable that, as in the above-described embodiment, the heat dissipation sheet 40 having low thermal resistance (excellent heat conduction) be disposed in the gap.

In the above-described embodiment, all of the screw members 50 are provided inside the refrigerant flow path 32. However, some of the screw members 50 are provided inside the refrigerant flow path 32 while remaining screw members 50 are provided outside the refrigerant flow path 32.

In the above-described embodiment, the heat dissipation sheet 40 having electrical conductivity is presented as an example. The heat dissipation sheet 40, however, may be electrically insulative.

In the above-described embodiment, the ceramic substrate 21 incorporates the wafer attraction electrode 22. However, the ceramic substrate 21 may incorporate, instead of or in addition to the wafer attraction electrode 22, a RF electrode for plasma generation. In this case, a high-frequency power source is connected to the RF electrode, not to the lower substrate 30. The ceramic substrate 21 may incorporate a heater electrode (resistance heating element). In this case, a heater power source is connected to the heater electrode. The ceramic substrate 21 may incorporate a single layer of an electrode and may incorporate two or more layers of an electrode.

In the above-described embodiment, the refrigerant flow path 32 is provided in a spiral shape from the inlet 32a to the outlet 32b. The shape of the refrigerant flow path 32 is, however, not particularly limited. In the above-described embodiment, the single refrigerant flow path 32 is provided. However, a plurality of the refrigerant flow paths 32 may be provided.

In the above-described embodiment, the ceramic substrate 21 is produced by subjecting a molded body of ceramic powder to hot press sintering. The molded body in this case may be produced by layering a plurality of tape molded bodies, may be produced by a mold casting method, and may be produced by compacting ceramic powder.

In the above-described embodiment, the lower substrate 30 is made of an easily machinable material. The lower substrate 30 is, however, not particularly limited thereto. For example, the lower substrate 30 may be made of a composite material of metal and ceramic. However, in consideration of material costs, using an easily machinable material, such as aluminum or an aluminum alloy, is preferable.

In the wafer placement table 10 in the above-described embodiment, a hole extending through the wafer placement table 10 from the lower surface of the lower substrate 30 to the wafer placement surface 21a may be provided. Examples of such a hole are a gas supply hole for supplying a thermally conductive gas (for example, a He gas) to the back side of the wafer W, a lift pin hole for inserting a lift pin that moves the wafer W upward and downward with respect to the wafer placement surface 21a, and the like.

International Application No. PCT/JP2022/025789, filed on Jun. 28, 2022, is incorporated herein by reference in its entirety.

What is claimed is:

1. A wafer placement table comprising:
   an upper substrate including a ceramic substrate that incorporates an electrode and having a wafer placement surface at an upper surface of the ceramic substrate;
   a lower substrate disposed on a surface of the upper substrate opposite to the wafer placement surface, and including a refrigerant flow path through which a refrigerant flows or a refrigerant flow-path groove constituting a side wall and a bottom of the refrigerant flow path;
   a through hole extending through the lower substrate in an up-down direction to intersect with the refrigerant flow path or the refrigerant flow-path groove;
   a screw hole provided, in a lower surface of the upper substrate, at a position facing the through hole;
   a screw member inserted from a lower surface of the lower substrate into the through hole and screwed into the screw hole; and
   a refrigerant-leakage prevention member that prevents the refrigerant from leaking out to the lower surface of the lower substrate through the through hole into which the screw member is inserted.

2. The wafer placement table according to claim 1,
   wherein the lower substrate includes the refrigerant flow-path groove, and
   wherein the upper substrate includes the ceramic substrate, a ceiling substrate disposed on a lower side of the ceramic substrate and constituting a ceiling of the refrigerant flow path, and a metal joint layer joining the ceramic substrate and the ceiling substrate to each other.

3. The wafer placement table according to claim 2,
   wherein an absolute value of a difference in a coefficient of linear thermal expansion at 40° C. to 400° C. between the ceiling substrate and the ceramic substrate is $1.5 \times 10^{-6}$/K or less.

4. The wafer placement table according to claim 3,
   wherein the ceiling substrate is made of a composite material of metal and ceramic.

5. The wafer placement table according to claim 1,
   wherein a heat dissipation sheet is disposed between the lower surface of the upper substrate and an upper surface of the lower substrate.

6. The wafer placement table according to claim 1,
   wherein the lower substrate is made of an easily machinable material.

* * * * *